(12) United States Patent
Kim et al.

(10) Patent No.: US 8,555,460 B2
(45) Date of Patent: Oct. 15, 2013

(54) APPARATUS FOR CLEANING SUBSTRATE

(75) Inventors: Geon-Yong Kim, Gyeonggi-do (KR);
Eun-Ha Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 705 days.

(21) Appl. No.: 12/654,162

(22) Filed: Dec. 11, 2009

(65) Prior Publication Data
US 2010/0162514 A1  Jul. 1, 2010

(30) Foreign Application Priority Data

Dec. 26, 2008  (KR) .................. 10-2008-0134995

(51) Int. Cl.
*B08B 5/00* (2006.01)

(52) U.S. Cl.
USPC ............................. 15/303; 15/302

(58) Field of Classification Search
USPC ............ 15/300.1, 301, 302, 303, 308, 309.1, 15/309.2, 306.1
See application file for complete search history.

(56) References Cited

U.S. PATENT DOCUMENTS

| | | | | |
|---|---|---|---|---|
| 1,923,635 A | * | 8/1933 | McCrery ..................... | 451/102 |
| 1,947,748 A | * | 2/1934 | Wormer ...................... | 15/308 |
| 5,063,951 A | | 11/1991 | Bard et al. | |
| 5,857,474 A | | 1/1999 | Sakai et al. | |
| 6,564,421 B2 | * | 5/2003 | Park et al. ................... | 15/302 |
| 2005/0250419 A1 | * | 11/2005 | Lujan et al. .................. | 451/5 |
| 2005/0268408 A1 | * | 12/2005 | Chin ............................ | 15/1.51 |

FOREIGN PATENT DOCUMENTS

| | | |
|---|---|---|
| CN | 101017771 A | 8/2007 |
| TW | I244669 B | 12/2005 |
| TW | I275423 B | 3/2007 |
| TW | 200815118 A | 4/2008 |
| TW | 200818283 A | 4/2008 |
| TW | 200830399 A | 7/2008 |

* cited by examiner

*Primary Examiner* — Robert Scruggs
(74) *Attorney, Agent, or Firm* — McKenna Long & Aldridge, LLP

(57) ABSTRACT

A substrate cleaning apparatus includes: a substrate entering guide unit for entering a substrate from outside in a proper direction; a foreign material removing unit for receiving the substrate from the substrate entering guide unit and removing debris formed on the substrate; a foreign material cleaning unit for receiving the substrate from the foreign material removing unit and cleaning to remove debris remaining on the substrate; and a position controller for controlling the position of the substrate carried out of the foreign material cleaning unit, wherein the foreign material cleaning unit includes: a manifold including a plurality of deionized water holes, suction holes and air holes; and a porous cleaning plate combined to the manifold by an upper fastening screw including a through hole communicating with the plurality of deionized water holes and suction holes.

6 Claims, 2 Drawing Sheets

APPARATUS FOR CLEANING SUBSTRATE

This application claims the benefit of Korean Patent Application No. 10-2008-0134995, filed Dec. 26, 2008, which is hereby incorporated by reference for all purposed as if fully set forth herein.

BACKGROUND OF THE INVENTION

1. Field of the Invention

The present invention relates to an apparatus for cleaning a substrate and, more particularly, to an apparatus for cleaning a substrate capable of preventing a leakage of a fastened face between a porous cleaning plate constituting a debris cleaning unit and a manifold and a corresponding hole part.

2. Discussion of the Related Art

In general, a liquid crystal display (LCD) displays an image by adjusting a light transmittance of liquid crystal cells according to video signals. An active matrix type LCD including switching elements formed at each pixel is advantageous to display video. As the switching elements, thin film transistors (TFTs) are commonly used.

The LCD includes two facing substrates and a liquid crystal layer disposed between the substrates. TFTs such as the switching elements as described above are formed on one of the substrates, and color filters are formed on another of the substrates. Before or after such process, the substrates undergo a cleaning process.

Various cleaning apparatus are used for the cleaning process. Among them, a porous cleaning apparatus performs a cleaning method as follows: A glass substrate is floated by using an air floating unit and introduced into a cleaning device. And a gap of 100 um or lower is formed between upper and lower portions of the glass substrate at a cleaning region by using the air floating unit, to which deionized water and air is supplied to simultaneously generate a deionized water flow and a bubble flow to remove particles and absorbed materials from the substrate.

The porous cleaning unit includes a porous cleaning plate, a manifold, and an upper frame, and the porous cleaning plate and the manifold are attached with an organic adhesive.

However, the related art porous cleaning unit has the following problem. That is, in the porous cleaning unit, the use of the organic adhesive to attach the porous cleaning plate and the manifold is not suitable for a cleaner with many holes. In particular, when the porous cleaning plate and the manifold are fastened with the organic adhesive, the organic adhesive is not evenly coated on the entire regions, generating an air leakage.

SUMMARY OF THE INVENTION

An object of the embodiments of the invention is to provide an apparatus for cleaning a substrate capable of preventing a leakage at a fastened surface between a porous cleaning plate constituting a foreign material cleaning unit and a manifold and at a corresponding hole portion.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims thereof as well as the appended drawings.

To achieve these and other advantages and in accordance with the purpose of embodiments of the invention, as embodied and broadly described, a substrate cleaning apparatus includes: a substrate entering guide unit for entering a substrate from outside in a proper direction; a foreign material removing unit for receiving the substrate from the substrate entering guide unit and removing debris formed on the substrate; a foreign material cleaning unit for receiving the substrate from the foreign material removing unit and cleaning to remove debris remaining on the substrate; and a position controller for controlling the position of the substrate carried out of the foreign material cleaning unit, wherein the foreign material cleaning unit includes: a manifold including a plurality of deionized water holes, suction holes and air holes; and a porous cleaning plate combined to the manifold by an upper fastening screw including a through hole communicating with the plurality of deionized water holes and suction holes.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF ILLUSTRATED EMBODIMENTS

A substrate cleaning apparatus according to an exemplary embodiment of the present invention will now be described in detail with reference to the accompanying drawings.

Figure 1:
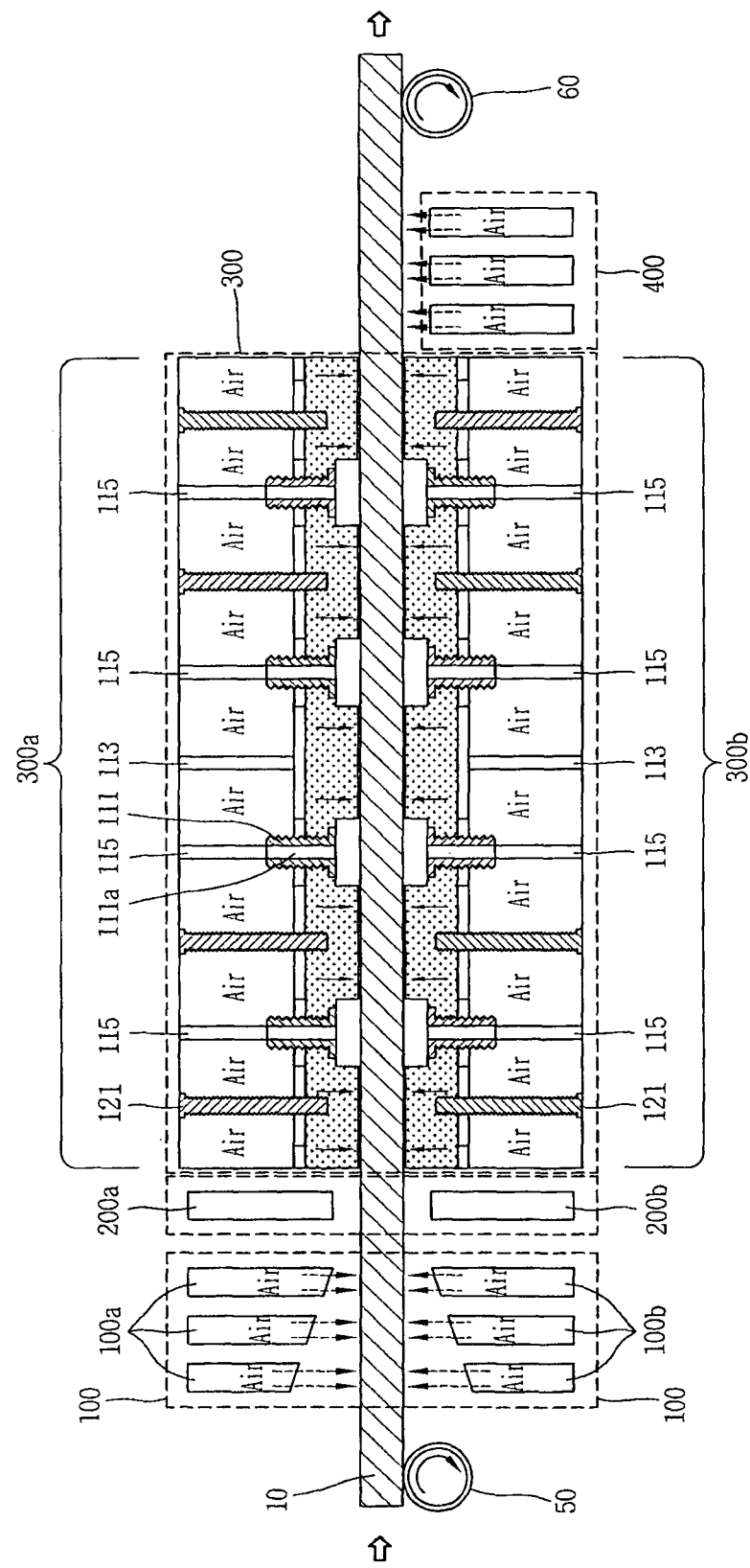
FIG. 1 is a schematic sectional view of a substrate cleaning apparatus according to an embodiment of the present invention.

FIG. 1 is a schematic sectional view of a substrate cleaning apparatus according to an embodiment of the present invention.

Figure 2:
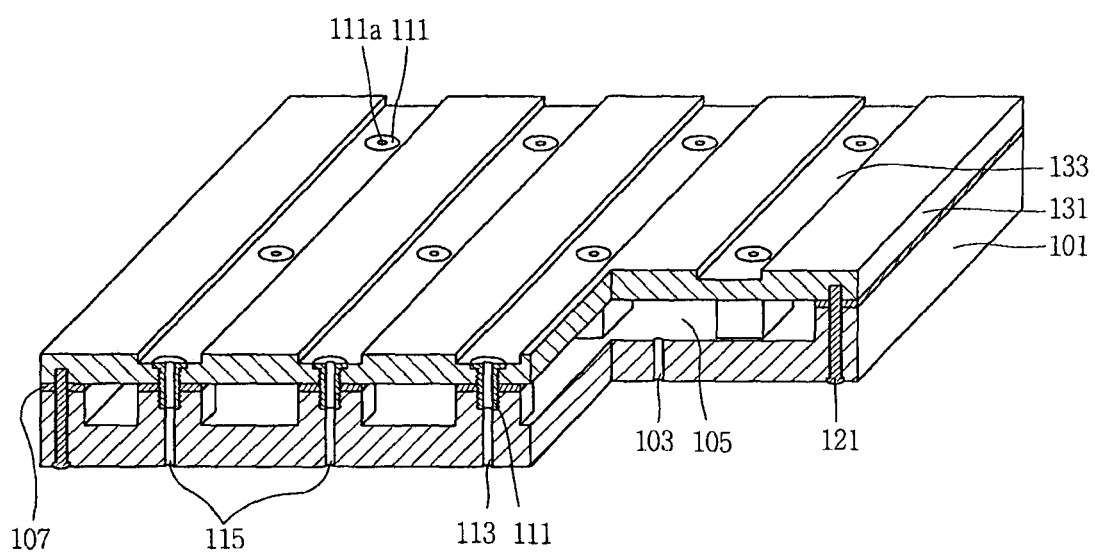
FIG. 2 is a schematic perspective view of a foreign material cleaning unit of the substrate cleaning apparatus according to an embodiment of the present invention.

FIG. 2 is a schematic perspective view of a foreign material cleaning unit of the substrate cleaning apparatus according to an embodiment of the present invention.

As shown in FIG. 1, the substrate cleaning apparatus according to an embodiment of the present invention includes: a substrate entering guide unit 100 for entering a substrate 10 from outside in a proper direction; a foreign material removing unit 200 for receiving the substrate 10 from the substrate entering guide unit 100 and removing debris formed on the substrate 10; a foreign material cleaning unit 300 for receiving the substrate 10 from the foreign material removing unit 200 and cleaning to remove debris remaining on the substrate 10; and a position controller 400 for controlling the position of the substrate 10 carried out of the foreign material cleaning unit 300.

The substrate entering guide unit 100, the foreign material removing unit 200, the foreign material cleaning unit 300, and the position controller 400 are made of a porous metal material. For example, the substrate entering guide unit 100, the foreign material removing unit 200, and the foreign material cleaning unit 300 may be made of a porous material among one of stainless steel, aluminum, an aluminum alloy, brass, hastelloy and zirconium.

In particular, the substrate entering guide unit 100, the foreign material removing unit 200, a foreign material cleaning unit 300, and the position controller 400 may be made of different metal porous materials. For example, the substrate entering guide unit 100 may be made of a stainless steel material, the foreign material removing unit 200 may be made of aluminum, the foreign material cleaning unit 200 may be made of an aluminum alloy, and the position controller 400 may be made of brass.

Here, the stainless steel, aluminum, an aluminum alloy, brass, hastelloy and zirconium are metals of high hardness. Thus, when the substrate entering guide unit 100, the foreign material removing unit 200, the foreign material cleaning unit 300, and the position controller 400 are made of these materials, chemical resistance of the cleaning apparatus can be improved.

In addition, the hardness of the enumerated metals is lower than that of the subject, namely, the substrate, to be cleaned. Thus, by forming the cleaning apparatus with those metals, although the substrate and the cleaning apparatus come in contact with each other during a cleaning process, the substrate can be prevented from being damaged.

For example, the hardness of the substrate may be 6~7 mohs, that of the stainless steel may be 5.5~6.3 mohs, and that of the aluminum alloy may be 2.4~2.8 mohs.

Each element will now be described in detail.

With reference to FIG. 1, the substrate entering guide unit 100 includes an entering guide path (not shown) for guiding the substrate 10 led in by a roller from the exterior to accurately enter the foreign material removing unit 200.

The entering guide path (not shown) has such a form that its width narrows toward the foreign material removing unit 200. With such entering guide path (not shown), the substrate 10 can be automatically moved toward the center of the entering guide path although the substrate 10 is not provided in an accurately aligned state to the center of the entering guide path (not shown).

The substrate entering guide unit 100 includes an upper structure 100a and a lower structure 100b that face each other. The upper structure 100a and the lower structure 100b are separated by a certain distance, between which the entering guide path is formed.

The upper structure 100a injects air toward the entering guide path (not shown) and sucks the injected air. Likewise, the lower structure 100b injects air toward the entering guide path and sucks the injected air. Accordingly, the substrate 10 which has entered the entering guide path is in a state of floating in the space of the entering guide path.

In other words, the upper substrate 100a injects air toward the upper surface of the substrate 10 which has entered the entering guide path and sucks the injected air, an the lower structure 100b injects air toward the lower surface of the substrate 10 which has entered the entering guide path and sucks the injected air, thereby maintaining the substrate 10 in a state of floating in the air. At this time, the injection force works more strongly than the suction force.

The two facing faces of the upper structure 100a and the lower structure 100b are sloped faces having a gradient of a certain angle. In detail, the sloped face of the upper structure 100a is tilt at a certain angle with respect to the upper surface of the substrate 10 and that of the lower structure 100b is tilt at a certain angle with respect to the lower surface of the substrate 10. The space between the two sloped faces corresponds to the entering guide path. The gap of the entering guide path may vary by adjusting the gap between the upper structure 100a and the lower structure 100b.

In order to allow air supplied from the exterior to pass through the upper structure 100a and the lower structure 100b and be injected to the substrate 10, the upper structure 100a and the lower structure 100b are made of metal porous material. That is, air injected toward the upper portion of the upper structure 100a from the exterior passes through the upper structure 100a so as to be supplied to the entering guide path, and air injected toward the lower portion of the lower structure 100b passes through the lower structure 100b so as to be supplied to the entering guide path.

The upper structure 100a and the lower structure 100b include a plurality of suction holes (not shown) to suck air. The suction holes formed in the upper structure 100a penetrates the upper structure 100a toward the entering guide path, and the suction holes (not shown) formed in the lower structure 100b penetrates the lower structure 100b toward the entering guide path.

The foreign material removing unit 200 includes an upper foreign material removing unit 200a and a lower foreign material removing unit 200b which face each other. The upper foreign material removing unit 200a and the lower foreign material removing unit 200b are spaced apart from each other, between which a movement space (not shown) is formed to allow the substrate 10 to move therethrough.

The upper foreign material removing unit 200a removes debris through a physical contact with the debris formed on the upper surface of the substrate 10, and the lower foreign material removing unit 200b removes debris through a physical contact with the debris formed on the lower surface of the substrate 10.

When the substrate 10 is positioned at the movement space between the upper foreign material removing unit 200a and the lower foreign material removing unit 200b, the gap between the upper foreign material removing unit 200a and the upper surface of the substrate 10 is around 20 um, and the gap between the lower foreign material removing unit 200b and the lower surface of the substrate 10 is around 20 um. Because the upper and lower foreign material removing units 200a and 200b are positioned to be close to each other, when the substrate 10 is moves through the movement space (not shown), debris formed to be protruded upward from the upper surface of the substrate 10 collides with the upper foreign material removing unit 200a so as to be removed, and debris formed to be protruded from the lower surface of the substrate 10 collides with the lower foreign material removing unit 200b so as to be removed. The gap between the upper and lower foreign material removing units 200a and 200b may be adjusted depending on the thickness of the substrate 10.

The upper and lower foreign material removing units 200a and 200b may be made of a metal porous material or a metal material.

Although not shown, the lower foreign material removing unit 200b may have the same configuration as the upper foreign material removing unit 200a as shown in FIG. 1. Namely, the lower foreign material removing unit 200b also includes a body, a removing unit and a plurality of suction holes.

The suction holes of the upper and lower foreign material removing units 200a and 200b serve to maintain the substrate 100 in a floated state as mentioned above.

The upper and lower foreign material removing units 200a and 200b may vibrate. Through vibration, the debris formed on the substrate 10 may be more effectively removed.

The upper and lower foreign material removing units 200a and 200b makes a reciprocal movement up and down as shown in FIG. 2. In this case, the upper foreign material removing unit 200a makes a reciprocal movement up and down toward the upper surface of the substrate such that it does not contact with the upper surface of the substrate 10, and the lower foreign material removing unit 200b makes a reciprocal movement up and down toward the lower surface of the substrate such that it does not contact with the lower surface of the substrate 10.

In addition, the upper foreign material removing unit 200a may make a reciprocal movement forwardly and backwardly or left and right in parallel to the upper surface of the substrate 10, and the lower foreign material removing unit 200b may make a reciprocal movement forwardly and backwardly or left and right in parallel to the lower surface of the substrate 10.

As shown in FIGS. 1 and 2, the foreign material cleaning unit 300 includes an upper foreign material cleaning unit 300a and a lower foreign material cleaning unit 300b which face each other. The upper and lower foreign material cleaning units 300a and 300b are spaced apart from each other, and a movement space (not shown) allowing the substrate 10 to be moved is formed at the space between the two separated structures 300a and 300b.

Here, the upper foreign material cleaning unit 300a injects air to the movement space through suction hole 115s and sucks the injected air. Likewise, the lower foreign material cleaning unit 300b injects air to the movement space through the suction holes 115 and sucks the injected air.

Accordingly, the substrate 10 which has entered the movement space is in a state of floating in the movement space. In other words, the upper foreign material cleaning unit 300a injects air toward the upper surface of the substrate 10 which has entered the movement space and sucks the injected air, an the lower foreign material cleaning unit 300b injects air toward the lower surface of the substrate 10 which has entered the movement space and sucks the injected air, thereby maintaining the substrate 10 in a state of floating in the movement space. At this time, the injection force works more strongly than the suction force.

In addition, the upper foreign material cleaning unit 300a injects a cleaning solution (deionized water) through deionized water holes 113 toward the movement space to generate bubble by using the cleaning solution and the injected air to remove debris formed on the upper surface of the substrate passing through the movement space.

In addition, the upper and lower foreign material cleaning units 300a and 300b externally discharge the cleaning solution by using the sucked air. The cleaning solution may include a deionized water, a chemical solution, or a mixture solution of deionizer water and the chemical solution.

In order to allow air supplied from the exterior to be injected to the movement space by passing through the upper and lower foreign material cleaning units 300a and 300b, the upper and lower foreign material cleaning units 300a and 300b are made of a metal porous material. Namely, the air injected toward the upper portion of the upper foreign material cleaning unit 300a from the exterior is supplied to the movement space by passing through the upper foreign material cleaning unit cleaning unit 300a, and passes through the lower foreign material cleaning unit 300b from the exterior so as to be supplied to the movement space.

The upper and lower foreign material cleaning units 300a and 300b include a plurality of deionized water holes 113 for injecting the cleaning solution and a plurality of suction holes 115 for sucking air. The plurality of dionized water halls 113 and the suction holes 115 are formed in a manifold 101, the plurality of dionized holes 113 and the suction holes 115 may be formed to communicate with through holes 111a formed at upper fastening screws 111 fastened to a porous cleaning plate 131 combined on the manifold 101. In this case, the upper fastening screws 111 with the through holes 111a are inserted at the contact portion of the manifold 101 and the porous cleaning plate 131 in order to prevent a leakage between the porous cleaning plate 131 and the manifold 101 as well as reinforcing adhesion therebetween.

The manifold 101 include an air hole 103 to provide an air passage 105 between the porous cleaning plate 131 and the manifold 101 when the porous cleaning plate 131 and the manifold 101 are combined. Accordingly, air is injected toward the substrate 10 through the entire surface of the porous cleaning plate 131 of the upper and lower foreign material cleaning units 300a and 300b through the air passage 105.

In addition, trenches 133 are formed on the porous cleaning plates 131 of the upper and lower foreign material cleaning units 300a and 300b, to allow a plurality of upper fastening screws 111 fastened to the manifold so as to be combined to be mounted at certain intervals.

The plurality of dionized water holes 113 and suction holes 115 communicate with the through holes 111a of the upper fastening screws 111 mounted on the trenches 133. The plurality of suction holes 115 suck air or the cleaning solution through the trenches 133, and the dionized water holes 113 inject the cleaning solution through the through holes 111a of the upper fastening screws 111. At this time, when the upper fastening screw 111 is fastened, it should be higher than the height of the trench 133, and the screw diameter should be smaller than the trench 133.

The trenches 133 are formed to be spaced apart in a direction perpendicular to the proceeding direction of the substrate 10. The cleaning solution is filled in the trenches 133 to enhance the cleaning effect of the substrate 10.

The manifold 101 and the porous cleaning plate 131 are combined by the lower fastening screws 121 together with the upper fastening screw 111. In this case, because the lower fastening screws 121 are inserted from the lower surface of the manifold 101 so as to be fastened to the porous cleaning plate 131, thus firmly combining the manifold 101 and the porous cleaning plate 131. At this time, the fastening by the lower fastening screws 121 obtains the balance between upper and lower forces to thus improve smoothness (flatness).

In addition, a packing 107 is inserted at the contact portion of the manifold 101 and the porous cleaning plate 131, thereby strengthening tight adhesion therebetween.

The packing 107 may be made of a material which is not much changed physically or chemically, for example, a Teflon-based material or a fluorine-based material.

As shown in FIG. 1, the position controller 400 maintains the substrate 10 in the flowing state by injecting air toward the lower surface of the substrate 10 being transferred and sucking the injected air. The substrate 10 is shifted from the position controller 400 to a next processing equipment through a roller 60.

As so far described, the substrate cleaning apparatus according to the embodiments of the present invention has such advantages that because the porous cleaning plate and the manifold are fastened with the upper fastening screws with through holes communicating with the dionized water and suction holes along with the lower fastening screws, an air leakage generated by the dionized water and suction hole can be prevented, and the fastening force between the metal porous plate and the manifold can be strengthened.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A substrate cleaning apparatus comprising:
   a substrate entering guide unit for entering a substrate from outside in a proper direction, wherein the substrate entering guide unit includes an upper structure and a lower structure facing each other, and the two facing faces of the upper structure and the lower structure are sloped faces having a gradient of a certain angle;
   a foreign material removing unit for receiving the substrate from the substrate entering guide unit and removing debris formed on the substrate;
   a foreign material cleaning unit for receiving the substrate from the foreign material removing unit and cleaning to remove debris remaining on the substrate; and
   a position controller for controlling the position of the substrate carried out of the foreign material cleaning unit,
   wherein the foreign material cleaning unit includes: a manifold including a plurality of deionized water holes, suction holes and air holes; and a porous cleaning plate combined to the manifold by an upper fastening screw including a through hole communicating with the deionized water holes and the suction holes,
   wherein the foreign material cleaning unit injects air to the substrate through the suction holes and sucks the injected air, and injects cleaning solution through the deionized water holes toward the substrate to generate bubble by using the cleaning solution and the injected air, and
   wherein the air holes are communicated with an air passage between the porous cleaning plate and the manifold so that air is injected toward the substrate through the entire surface of the porous cleaning plate of the foreign material cleaning units through the air passage.

2. The apparatus of claim 1, wherein a packing is inserted at the contact portion of the manifold and the porous cleaning plate.

3. The apparatus of claim 2, wherein the packing is made of Teflon-based material or a fluorine-based material.

4. The apparatus of claim 1, wherein a lower fastening screw is mounted on a lower surface of the manifold to combine the manifold and the porous cleaning plate.

5. The apparatus of claim 1, wherein as the manifold and the porous cleaning plate are combined, the air passage communicating with the air hole is formed between the manifold and the porous cleaning plate.

6. The apparatus of claim 1, wherein a trench is formed in a lengthwise direction of the cleaning plate at the region of the porous cleaning plate where the upper fastening screw is mounted.

\* \* \* \* \*